(12) United States Patent
Weber et al.

(10) Patent No.: US 8,716,788 B2
(45) Date of Patent: May 6, 2014

(54) SEMICONDUCTOR DEVICE WITH SELF-CHARGING FIELD ELECTRODES

(75) Inventors: Hans Weber, Bayerisch Gmain (DE); Franz Hirler, Isen (DE); Stefan Gamerith, Villach (AT)

(73) Assignee: Infineon Technologies Austria AG, Villach (AT)

( * ) Notice: Subject to any disclaimer, the term of this patent is extended or adjusted under 35 U.S.C. 154(b) by 67 days.

(21) Appl. No.: 13/250,013

(22) Filed: Sep. 30, 2011

(65) Prior Publication Data

US 2013/0082322 A1    Apr. 4, 2013

(51) Int. Cl.
*H01L 29/66*    (2006.01)

(52) U.S. Cl.
USPC ............................ 257/332; 257/330; 257/328

(58) Field of Classification Search
USPC .................. 257/330, 332, 328, 327, E29.309
See application file for complete search history.

(56) References Cited

U.S. PATENT DOCUMENTS

| | | | |
|---|---|---|---|
| 6,605,862 B2 * | 8/2003 | Van Dalen et al. | ........... 257/621 |
| 6,734,520 B2 | 5/2004 | Kapels et al. | |
| 7,173,306 B2 | 2/2007 | Hirler et al. | |
| 7,465,987 B2 | 12/2008 | Krumrey et al. | |
| 7,723,782 B2 | 5/2010 | Hirler | |
| 7,781,842 B2 | 8/2010 | Hirler et al. | |
| 7,893,486 B2 | 2/2011 | Hirler et al. | |
| 2007/0023830 A1 * | 2/2007 | Pfirsch et al. | ................. 257/341 |
| 2010/0117144 A1 | 5/2010 | Hirler et al. | |

FOREIGN PATENT DOCUMENTS

| | | |
|---|---|---|
| DE | 103 39 455 B3 | 5/2005 |
| DE | 10 2005 047 056 B3 | 1/2007 |
| DE | 10 2005 041 322 A1 | 3/2007 |
| DE | 10 2005 041 358 A1 | 3/2007 |
| DE | 10 2007 020 659 A1 | 11/2008 |
| DE | 10 2005 041 257 B4 | 6/2009 |
| DE | 10 2005 041 285 B4 | 6/2009 |
| DE | 10 2009 044 474 A1 | 5/2010 |
| EP | 1 131 852 B1 | 9/2001 |

* cited by examiner

*Primary Examiner* — Matthew Reames
(74) *Attorney, Agent, or Firm* — Murphy, Bilak & Homiller, PLLC

(57) ABSTRACT

Disclosed is a semiconductor device including a drift region of a first doping type, a junction between the drift region and a device region, and at least one field electrode structure in the drift region. The field electrode structure includes a field electrode, a field electrode dielectric adjoining the field electrode and arranged between the field electrode and the drift region, and having an opening, at least one of a field stop region and a generation region.

19 Claims, 11 Drawing Sheets

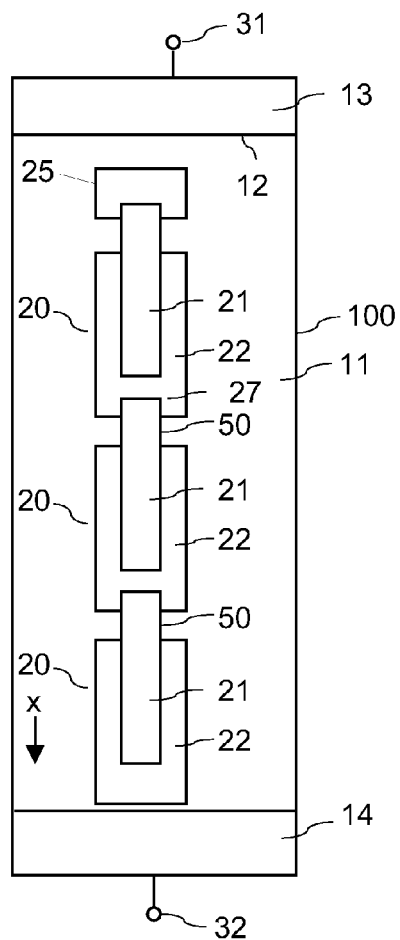
FIG 15
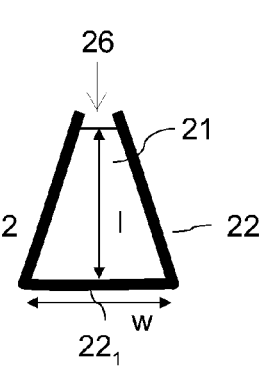
FIG 16A
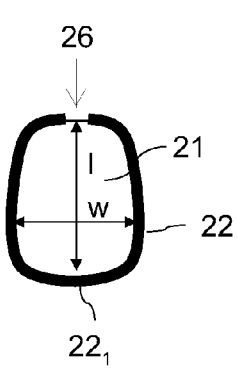
FIG 16B
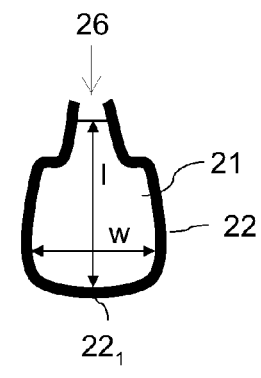
FIG 16C
FIG 16D

SEMICONDUCTOR DEVICE WITH SELF-CHARGING FIELD ELECTRODES

TECHNICAL FIELD

Embodiments of the present invention relate to a semiconductor device, in particular a power semiconductor device.

BACKGROUND

Power semiconductor devices, such as power MOS (metal oxide semiconductor) transistors or power diodes, include a drift region and a pn junction between the drift region and a body region in an MOS transistor and between the drift region and an emitter region in a diode. The doping concentration of the drift region is lower than the doping concentration of the body and emitter region, so that a depletion region (space charge region) mainly expands in the drift region when the device blocks, which is when the pn junction is reverse biased.

The dimension of the drift region in a current flow direction of the device and the doping concentration of the drift region mainly define the voltage blocking capability of the semiconductor device. In a unipolar device, such as a power MOSFET (metal oxide semiconductor field effect transistor), the doping concentration of the drift region also defines the on-resistance of the device, which is the electrical resistance of the semiconductor device in the on-state.

When the pn junction is reverse biased dopant atoms are ionized on both sides of the pn junction resulting in a space charge region that is associated with an electrical field. The integral of the magnitude of the field strength of the electrical field corresponds to the voltage that reverse biases the pn junction, where the maximum of the electrical field is at the pn junction. An Avalanche breakthrough occurs when the maximum of the electrical field reaches a critical field strength that is dependent on the type of semiconductor material used to implement the drift region.

The doping concentration of the drift region may be increased without reducing the voltage blocking capability of the device when charges are provided in the drift region that may act as counter charges to ionized dopant atoms in the drift region when the pn junction is reverse biased so that a depletion region expands in the drift region.

According to a known concept, field electrodes or field plates are provided in the drift region and are dielectrically insulated from the drift region by a field electrode dielectric. These field electrodes may provide the required counter charges.

According to one known concept, these field electrodes are electrically connected to a fixed electrical potential, such as gate or source potential in a MOSFET. However, this may result in a high voltage between the field electrode and those regions of the drift region close to the drain region in a MOSFET, so that a thick field electrode dielectric would be required. A thick field electrode dielectric, however, reduces the desired compensation effect.

According to a further known concept, several field electrodes are arranged distant to each other in a current flow direction of the drift region and these field electrodes are connected to different voltage sources, so as to bias these field electrodes to different potentials. Implementing the voltage sources, however, is difficult.

According to yet another known concept, the field electrodes are electrically connected to a doped semiconductor region of the same doping type as the drift region through a contact electrode arranged above a semiconductor body. This "coupling region" is at least partially shielded against the drift region by a semiconductor region of a complementary doping type.

There is a need to reduce the on-resistance and to increase the voltage blocking capability of a semiconductor device with a drift region.

SUMMARY

A first embodiment relates to a semiconductor device including a drift region of a first doping type, a junction between the drift region and a device region, and at least one field electrode structure in the drift region. The field electrode structure includes a field electrode, a field electrode dielectric adjoining the field electrode and arranged between the field electrode and the drift region, and having an opening, and a field stop region of the first doping type and more highly doped than the drift region, the field stop region connecting the field electrode to the drift region through the opening of the field electrode dielectric.

A second embodiment relates to a semiconductor device including a drift region of a first doping type, a junction between the drift region and a device region, and at least one field electrode structure in the drift region. The field electrode structure includes a field electrode, a field electrode dielectric adjoining the field electrode and arranged between the field electrode and the drift region, and having an opening, and a generation region connecting the field electrode to the drift region through the opening of the field electrode dielectric or arranged in the field electrode.

A third embodiment relates to a method for producing a field electrode structure in a semiconductor body. The method includes forming a trench in the semiconductor body, forming a first dielectric layer on sidewalls of the trench, forming a second dielectric layer on a bottom of the trench, and forming a first polysilicon layer having a surface on the second dielectric layer. The method further includes forming a void in the region of the surface of the polysilicon layer, the void extending through the first dielectric layer so as to uncover semiconductor material of the semiconductor body, and growing a monocrystalline semiconductor material on the uncovered regions of the semiconductor body in the void and a second polysilicon layer on the first polysilicon layer. The first and second polysilicon layers form a field electrode and the first dielectric layer below the void and the first dielectric layer form a field electrode dielectric.

A third embodiment relates to a method for producing a field electrode structure in a semiconductor body. The method includes forming a trench extending from a first surface in a first semiconductor layer, forming a first dielectric layer on sidewalls of the trench, forming a second dielectric layer on a bottom of the trench, and forming a field electrode in the trench, wherein the field electrode does not completely fill the trench. The method further includes growing a second semiconductor layer on uncovered sections of the first semiconductor layer on the first surface, the second semiconductor layer also covering the first dielectric layer on the first surface, the second semiconductor layer leaving an opening above the trench, and growing a third semiconductor layer on the second semiconductor layer, the third semiconductor layer closing the trench, leaving a void above the field electrode.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features. In the drawings:

FIG. 15 illustrates a further embodiment of a semiconductor device including a plurality of field electrode structures;

FIG. 16 which includes FIGS. 16A to 16D, illustrates further embodiments of a field electrode and a field electrode dielectric of the field electrode structure;

FIG. 22 which includes

FIG. 23 which includes

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
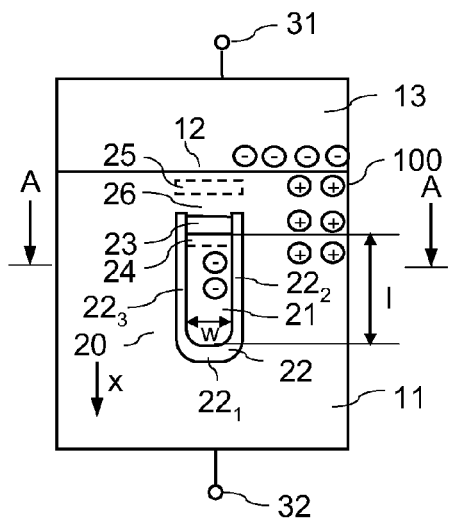
FIG. 1 illustrates a cross sectional view of a semiconductor device including a field electrode structure according to a first embodiment.

FIG. 1 illustrates a cross sectional view of a semiconductor device according to a first embodiment. The semiconductor device includes a semiconductor body 100, a drift region 11 of a first doping type and a junction 12 between the drift region 11 and a further device region 13. The junction 12 is either a pn junction or a Schottky junction. In the first case, the further device region 13 is a semiconductor region of a second doping type complementary to the first doping type. In the second case, the further device region 13 is a Schottky region or Schottky metal, such as, for example, aluminum (Al), tungsten silicide (WSi), tantalum silicide (TaSi), titanium silicide (TiSi), platinum silicide (PtSi), or cobalt silicide (CoSi).

The further device region 13 is electrically coupled to a first electrode or terminal 31, and the drift region 11 is electrically coupled or connected to a second electrode or terminal 32. These first and second electrodes are only schematically illustrated in FIG. 1.

The semiconductor device further includes at least one field electrode structure 20 in the drift region 11. The semiconductor device may include further device features, such as, for example, a gate electrode when the semiconductor device is implemented as a MOS transistor. However, in FIG. 1, as well as in FIGS. 2 to 9, only those features of the semiconductor device are illustrated that are necessary to understand the operating principle of the field electrode structure 20 arranged in the drift region 11. This field electrode structure 20 can be employed in each semiconductor device that includes a drift region, such as drift region 11 illustrated in FIG. 1, and a junction, such as junction 12 between the drift region 11 and the further device region 13 illustrated in FIG. 1. Semiconductor devices having a drift region and a junction between the drift region and a further device regions are, but are not limited to, MOS transistors, such as MOSFETs (Metal Oxide Gate Field-Effect Transistors) or IGBTs (Insulated Gate Bipolar Transistors), p-i-n diodes, Schottky diodes, JFETs (Junction Field-Effect Transistors). Field electrode structures 20 as explained with reference to FIGS. 1 to 9 may be employed in vertical devices, in which a current flow direction of the device corresponds to a vertical direction of a semiconductor body of the device, or in lateral devices in which a current flow direction of the device corresponds to a lateral (horizontal) direction of a semiconductor body of the device.

Referring to FIG. 1, the field electrode structure 20 includes a field electrode 21 and a field electrode dielectric

22. The field electrode dielectric 22 adjoins the field electrode 21, is arranged between the field electrode 21 and the drift region 11 and has an opening 26, so that the field electrode dielectric 22 does not completely surround the field electrode 21 within the drift region 11. The field electrode structure 20 further includes a field stop region 23 of the first doping type and more highly doped than the drift region 11. The field stop region 23 couples or connects the field electrode 21 to the drift region 11 through the opening 26 of the field electrode dielectric 22. The doping concentration of the drift region 11 is, for example, in the range of between $10^{14}$ cm$^{-3}$ (1e14 cm$^{-3}$) and $10^{18}$ cm$^{-3}$ (1e18 cm$^{-3}$). The doping concentration of the field stop region 23 is, for example, in the range of between $10^{16}$ cm$^{-3}$ (1e16 cm$^{-3}$) and $10^{20}$ cm$^{-3}$ (1e20 cm$^{-3}$). The doping of the field stop region 23 is such that the field stop region 23 cannot be completely depleted of charge carriers when the depletion region expanding in the drift region 11 reaches the field stop region 23. When the semiconductor body 100 includes silicon as a semiconductor material, the field stop region 23 cannot be completely depleted of charge carriers when a dopant dose in the field stop region 23 is higher than about $2 \cdot 10^{12}$ cm$^{-2}$ (2e12 cm$^{-2}$). The dopant dose of the field stop region 23 corresponds to the integral of the doping concentration of the field stop region 23 in the current flow direction x.

The field electrode dielectric 22 includes, for example, an oxide, a nitride, a high-k dielectric, a low-k dielectric, or the like. The field electrode dielectric 22 may even include a gas or a vacuum formed in a void surrounding the field electrode 21. According to one embodiment, the field electrode dielectric 22 is a composite layer with two or more different dielectric layers.

The semiconductor device has a current flow direction x, which is a direction in which charge carriers flow in the drift region 11 when the semiconductor device is conducting (is in an on-state). The field electrode 21 has a length l, which is a dimension of the field electrode 21 in the current flow direction x and has a width w, which is a dimension of the field electrode 21 in a direction perpendicular to the current flow direction x. One field electrode 21 may have a varying length and a varying width. In this case, the length "l" denotes the maximum of the length of the field electrode 21 and the width "w" defines the maximum of the width of the field electrode 21. The field electrode dielectric 22 basically has a U-shape with a bottom section $22_1$ and two leg sections $22_2$, $22_3$. The width w of the field electrode 21 is the dimension of the field electrode 21 between the two leg sections $22_2$, $22_3$ of the field electrode dielectric 22. As will be explained with reference to FIGS. 16A to 16D the U-shape of the field electrode dielectric 22 can be modified in many different ways. However, the modified U-shape also includes a bottom section $22_1$ and two leg sections defining the width w and between which the field electrode 21 is arranged.

An aspect ratio of the field electrode 21, which is the ratio between the length l and the width w is higher than 1, i.e. l/w>1. According to one embodiment, the aspect ratio 11w is between 1 and 50, in particular between 5 and 50. The thickness of the field electrode dielectric 22, which is a dimension of the field electrode dielectric 22 between the field electrode 21 and the drift region 11, may vary. According to one embodiment, this thickness is between 10 nm and 2 μm.

The field electrode 22 has two longitudinal ends, which are those ends of the field electrode 21 in the direction of the current flow direction x. A first longitudinal end of the field electrode 21 faces the bottom section $22_1$ of the field electrode dielectric 22. The second longitudinal end of the field electrode 21 faces the opening 26 of the field electrode dielectric 22, where this opening 26 in the embodiment illustrated in FIG. 1 faces or is located in the direction of the junction 12 of the semiconductor device.

Before disclosing further details on possible implementations of the field electrode 21 and the field stop region 23, the basic operating principle of the semiconductor device, in particular of the field electrode structure 20, is explained with reference to FIG. 1. For explanation purposes it is assumed that the drift region 11 is n-doped, so that the junction 12 is reverse biased when a positive voltage is applied between the drift region 11 and the further device region 13 or between the second and first terminals 32, 31, respectively. However, the operating principle explained below also applies to a semiconductor device with a p-doped drift correspondingly.

When the junction 12 is reverse biased a depletion region (space charge region) expands in the drift region 11 beginning at the junction 12. The width of the depletion region, which is a dimension of the depletion region in a direction perpendicular to junction 12, is dependent on the voltage that reverse biases the junction 12; the width of the depletion region increases when the reverse biasing voltage increases. Within the depletion region there are ionized dopant atoms in the drift region 11. These ionized dopant atoms have a positive charge when the drift region 11 is n-doped (and have a negative charge when the drift region is p-doped). Negative charges corresponding to the positive charges in the drift region 11 are located in the further device region 13 on the other side of the junction 12. When the depletion region reaches the field stop region 23, an ionization process also sets in the field stop region 23 that has the same doping type as the drift region 11. In an n-doped field-stop region 23 electrons are generated thereby leaving positive dopant ions in the field stop region 23 (these ionized dopant atoms are not illustrated in FIG. 1). By virtue of the electric field caused by the positively charged ionized dopant atoms in the field stop region 23 and the drift region 11 the electrons generated in the field stop region 23 are driven away from the junction 12 in the current flow direction x of the semiconductor device. The field stop region 23 is adjacent the field electrode 21 in the current flow direction so that the electrons generated in the field stop region 23 are driven into the field electrode 21. By virtue of the field electrode dielectric 22 the electrons are "trapped" in the field electrode 21, so that the field electrode 21 is negatively charged. Through this, not only the further device region 13 but also the field electrode 21 provides negative charges (counter charges) corresponding to positive charges in the drift region 11.

The voltage blocking capability of the semiconductor device is reached when the electrical field generated by ionized dopant atoms in the drift region 11 and corresponding counter charges in the further device region 13 reaches the critical electrical field. The critical electrical field is a material constant of the semiconductor material of the semiconductor body, such as silicon. The reverse biasing voltage at which the critical electrical field is reached at the junction 12 is dependent on the doping concentration of the drift region 11 and is, therefore, dependent on the number of dopant atoms that can be ionized when a reverse biasing voltage is applied to the junction 12. When, however, like in the semiconductor device of FIG. 1, ionized dopant atoms in the drift region 11 find corresponding counter charges not only in the further device region 13 on the other side of the junction 12 but also within the drift region 11, namely in the field electrode 21, the doping concentration of the drift region 11 can be increased without decreasing the voltage blocking capability of the semiconductor device. Increasing the doping concentration of the drift region 11 is beneficial concerning the on-resistance of the semiconductor device. In a unipolar semiconductor device, such as, for example a MOSFET or a Schottky diode, the on-resistance is mainly defined by the ohmic resistance of the drift region 11, where the ohmic resistance of the drift region 11 decreases when the doping concentration of the drift region 11 increases.

The field electrode 21 is adjacent the field stop region 23 in the current flow direction so that charge carriers flow from the field stop region 23 into the field electrode 21 where they are trapped. The process of generating charge carriers that are trapped in the field electrode 21 is reversible, which means electrons trapped in the field electrode 21 flow back into the field stop region 23 when the depletion region in the drift region 11 is removed by switching off the reverse biasing voltage.

The charge carriers that flow into the field electrode 21 when the depletion region reaches the field stop region 23 are n-type charge carriers (electrons) when the drift region 11 and the field stop region 23 are n-doped regions. In this case, the field electrode 21 is negatively charged. When, however, the drift region 11 and the field stop region 23 are p-doped regions, p-type charge carriers flow into the field electrode 21, thereby positively charging the field electrode. When, for example, the field electrode 21 includes a metal, the flowing of p-type charge carriers into the field electrons corresponds to the flowing of electrons from the metal field electrode 21 into the field stop region 23.

Referring to FIG. 1, the field stop region 23 can be arranged completely within the field electrode dielectric 23, so that the field stop region 23 does not extend beyond the opening 26 of the field electrode dielectric 22 in the current flow direction x of the semiconductor device. The field electrode 21 includes, for example, a monocrystalline semiconductor material of the first doping type, a polycrystalline or amorphous semiconductor material, or a metal. An electrically conductive contact or contact region 24 may be arranged between the field stop region 23 and the field electrode 21 that electrically connects the field stop region 23 to the field electrode 21. When the field electrode 21 is a monocrystalline semiconductor region of the first doping type, the doping concentration of the field electrode 21 may correspond to the doping concentration of the field stop region 23. In this case both functions (field stop and field electrode) may be provided within the same semiconductor region. However, it is also possible for the field stop region 23 and the field electrode 21 to have different doping concentrations. According to one embodiment, the doping concentration of the field electrode 21 corresponds to the doping concentration of the drift region 11.

Optionally, the field electrode structure 20 includes a shielding structure 25 that is arranged distant to the opening 26 of the field electrode dielectric 22 in the current flow direction x. The shielding structure 25 is in line with the field electrode structure 20. A width of the shielding structure 25, which is a dimension of the shielding structure 25 in a direction perpendicular to the current flow direction may correspond to a width of the field electrode structure 20 or may be larger than the width of the field electrode structure 20.

According to one embodiment, the shielding structure 25 only includes a dielectric, such as, for example, an oxide. According to a further embodiment, the shielding structure 25 includes an electrode dielectrically insulated from the semiconductor regions, such as the drift region 11, by a dielectric. The electrode is, for example, electrically connected to a reference potential. This reference potential may be the electrical potential of the first terminal 31. In a MOSFET, that will be explained with reference to FIGS. 17 to 20 below, the reference potential could also be the electrical potential of the gate electrode. An electrode of the shielding structure 25 connected to a reference potential may provide counter charges to the charges in the field stop region 23 when the device is in a blocking state. According to a further embodiment, the shielding structure 25 is a semiconductor region of a doping type complementary to the doping type of the drift region 11.

Figure 2:
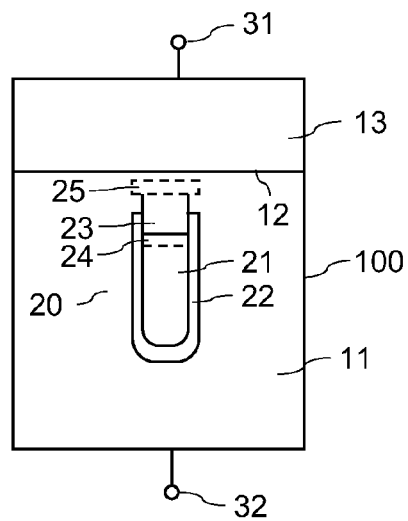
FIG. 2 illustrates a cross sectional view of a semiconductor device including a field electrode structure according to a second embodiment.

FIG. 2 illustrates a modification of the semiconductor device illustrated in FIG. 1. In the semiconductor device according to FIG. 2, the field stop region 23 extends through the opening 26 of the field electrode dielectric 22, so that the field stop region 23 extends beyond the opening 26 of the field electrode dielectric 22 in the current flow direction x. In the direction perpendicular to the current flow direction x the field stop region 23 does not extend beyond the field electrode dielectric 22 in the embodiment illustrated in FIG. 2.

Figure 3:
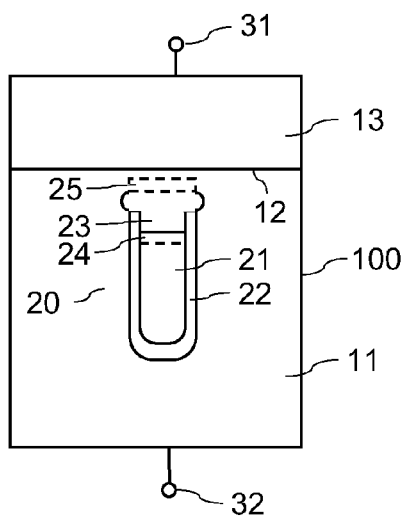
FIG. 3 illustrates a cross sectional view of a semiconductor device including a field electrode structure according to a third embodiment.

Referring to FIG. 3, the field stop region 23 may also extend beyond the field electrode dielectric 22 in the direction perpendicular to the current flow direction x. However, in this direction the field stop region 23 does not extend beyond the field electrode dielectric 22 more than 200 nm, more than 100 nm, or even not more than 50 nm.

In the embodiments illustrated in FIGS. 1 to 3 the field stop region 23 and the field electrode dielectric 22 completely separate the field electrode 21 and the drift region 11. However, this is only an example. According to a further embodiment illustrated in FIG. 4, a section of the field electrode 21 adjoins the drift region 11 next to the field stop region 23. In the embodiment illustrated in FIG. 4, the field stop region 23 has two field stop region sections between which the field electrode 21 extends to the drift region 11. However, this is only an example. According to a further embodiment (not illustrated) the field stop region 23 includes only one section. In the embodiment illustrated in FIG. 4, the field stop region 23 is completely arranged within the field electrode dielectric 22. However, the field stop region 23 could also extend beyond the opening of the field electrode dielectric 22 in the current flow direction.

Figure 4:
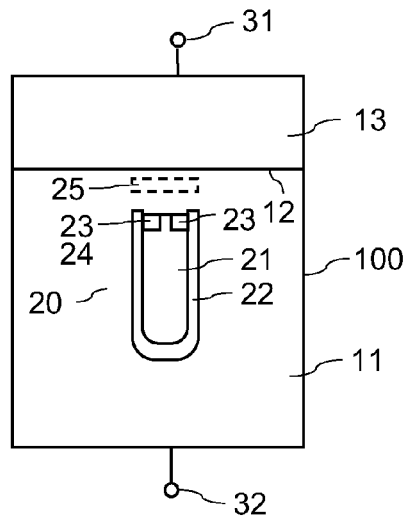
FIG. 4 illustrates a cross sectional view of a semiconductor device including a field electrode structure according to a fourth embodiment.
Figure 5:
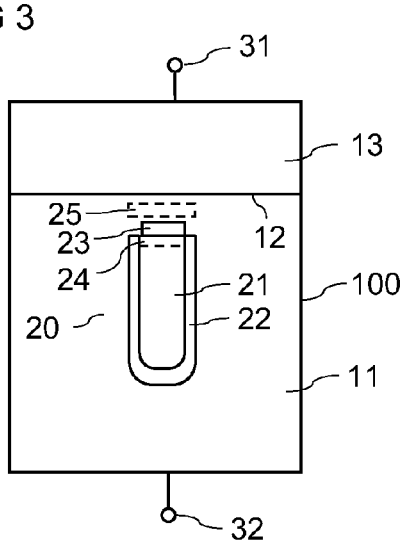
FIG. 5 illustrates a cross sectional view of a semiconductor device including a field electrode structure according to a fifth embodiment.

FIG. 5 illustrates a further embodiment of the semiconductor device. In this embodiment, the field stop region 23 is only arranged outside the field electrode dielectric 22. In this embodiment, the field electrode 21 or the optional contact 24 extends to the opening of the field electrode dielectric 22 and adjoins the field stop region 23. In the embodiment illustrated in FIG. 5, the field stop region 23 (and the field electrode dielectric 22) completely separate the field electrode 21 and the drift region 11. However, this is only an example. There could also be sections of the field electrode 21 that adjoin the drift region 11, e.g. as illustrated in FIG. 4.

Figure 6:
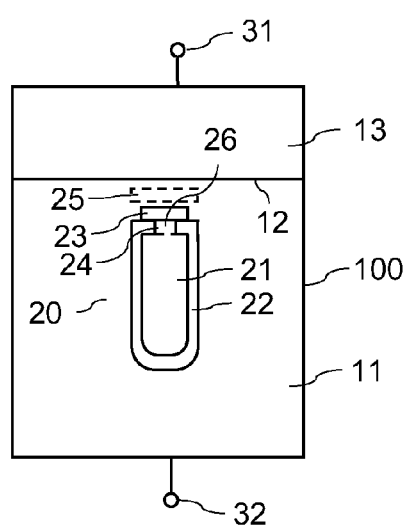
FIG. 6 illustrates a cross sectional view of a semiconductor device including a field electrode structure according to a sixth embodiment.

Although the size of the opening 26 corresponds to the width w of the field electrode 21 in the embodiments illustrated in FIGS. 1 to 5, this is only an example. Referring to FIG. 6, the field electrode dielectric 22 can be implemented with an opening 26 that is smaller than the width w of the field electrode 21. This small opening of the field electrode dielectric 22 can be employed with each of the embodiments explained with reference to FIGS. 1 to 5. Having the field stop region 23 arranged outside the field electrode dielectric 22 and adjoining the field electrode 21 or the contact 24 in the opening 26 as illustrated in FIG. 6, is only one of many different embodiments of implementing the field stop region 23 in connection with a smaller opening.

Figure 7:
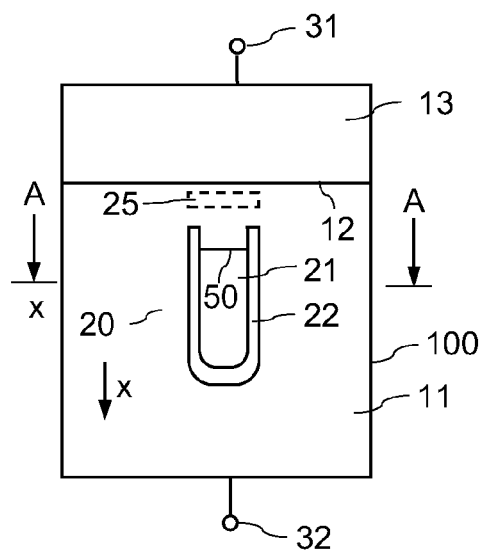
FIG. 7 illustrates a cross sectional view of a semiconductor device including a field electrode structure according to a seventh embodiment.

FIG. 7 illustrates a further embodiment of a semiconductor device with a field electrode structure 20. This field electrode structure 20 includes a generation region 50 that is configured to generate charge carrier pairs, namely holes and electrons, when the depletion region reaches the generation region 50 when the junction 12 is reverse biased. Unlike the field stop region 23 explained with reference to FIGS. 1 to 6 that generates a first type of charge carriers, namely electrons in the example explained before, flowing into the field electrode 21 and fixed charge carriers of a second type, namely positive ionized dopant atoms, the generation region 50 generates two types of charge carriers that can move within the drift region 11. For explanation purposes it is again assumed that the drift region 11 is an n-type drift region so that there are positive dopant ions (ionized dopant atoms) in the drift region 11 when the junction 12 is reverse biased. When the depletion region 11 reaches the generation region 50 electrons and holes are generated, whereas electrons by virtue of the electric field are driven away from the junction 12 and into the field electrode 21 within the field electrode dielectric 22. The effect of trapping the electrons in the field electrode 21 is the same as explained with reference to FIG. 1. The holes are driven in the direction of the junction 12 and reach the first electrode 31 (that is only schematically illustrated and that may include a metal), where they recombine with electrons, or some of the holes accumulate at the optional shielding structure 25 that prevents the holes from flowing to the junction 12.

The at least one generation region 50 can be implemented in many different ways. According to one embodiment, the generation region 50 is an interface region between the field electrode 21 and the drift region 11. In this case, the field electrode 21 includes, for example, a metal, or a silicide. According to a further embodiment, the field electrode 21 includes a polycrystalline semiconductor material, an amorphous semiconductor material or a monocrystalline semiconductor material into which foreign material atoms are implanted or diffused or that includes crystal defects. Suitable foreign material atoms are, for example, heavy metal atoms, such as, for example, gold atoms, or platinum atoms. Crystal defects can be generated by implanting particles, such as argon (Ar) or germanium (Ge) atoms, semiconductor atoms, or the like, into the field electrode. When the field electrode 21 includes a polycrystalline or an amorphous semiconductor material or a monocrystalline semiconductor material with foreign material atoms or crystal defects, there is a plurality of generation regions 50 within the field electrode 21. Each of the foreign material atoms or each of the crystal defects in a monocrystalline material or the inherent crystal borders in a monocrystalline or an amorphous material may act as a generation region. The position of the generation region 50 relative to the field electrode 21 may correspond to the position of the field stop region 23 relative to the field electrode 21 explained before. Like the field stop region 23 explained with reference to FIGS. 1 to 6, the generation region 50 can be adjacent the field electrode 21 in the current flow direction x of the semiconductor device, so that charge carriers, such as electrons, that are generated in the generation region 50 flow into the field electrode 21 where they are trapped. However, it is also possible to provide at least one generation region 50 within the field electrode 21, for example, when the field electrode 21 includes a polycrystalline or an amorphous semiconductor material or a monocrystalline semiconductor material with crystal defects. Like the effect that has been explained with reference to the field stop region 23, charging the field electrode 21 is reversible. When the voltage that reverse biases the junction is reduced or switched off, charge carriers trapped in the field electrode 21 are removed from the field electrode 21, so as to discharge the field electrode 21. These charge carriers may either recombine at the generation region 50 with complementary charge carriers or may flow to one of the electrodes 31, 32 via the drift region 11. When, for example, the drift region 11 is n-doped, so that electrons are trapped in the field electrode 21 when the junction 12 is reverse biased, these electrons recombine with holes at the generation region 50 or flow to the second electrode 32 when the reverse biasing voltage is switched off or is reduced. The number of electrons that recombine with holes is dependent on the number of holes that are kept in the drift region 11 when the junction is reverse biased. When the junction is reverse biased, holes are, for example, kept at the shielding structure 25 that may act as a trap for charge carriers that are complementary to charge carriers that charge the field electrode 21.

The field electrode structure 20 may include a field stop region 23 and a generation region 50, which means, the field stop region 23 and the generation region 50 can be combined in one field electrode structure. When, for example, in the embodiment illustrated in FIG. 4, the field electrode 21 includes a metal, a polycrystalline or amorphous semiconductor material, or a monocrystalline semiconductor material with foreign material atoms or crystal defects there is a generation region at or close to the interface between the field electrode 21 and the drift region 11, or in the field electrode 21. According to a further embodiment (not illustrated), the semiconductor device includes a field stop region 23 of the same doping type as the drift region 11 as explained before and a semiconductor region of a complementary doping type. The field stop region 23 and the complementary semiconductor region are connected by a metallic electrode, and the complementary region may be arranged between the field stop region 23 and the field electrode 21. In this embodiment, the field stop region 23, the metallic electrode and the complementary region form a generation region, so that both a field stop region and a generation region are available in this device.

Figure 8:
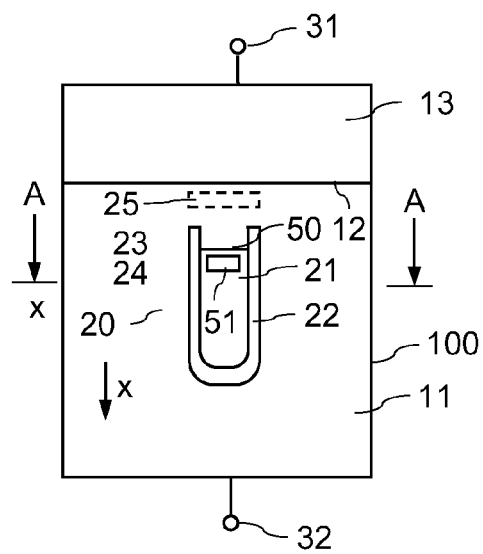
FIG. 8 illustrates a cross sectional view of a semiconductor device including a field electrode structure according to an eighth embodiment.

FIG. 8 illustrates a further embodiment of a semiconductor device including a field electrode structure 20 with a generation region 50. In this embodiment, the field electrode 21 includes a metal or silicide region 51. This metal or silicide region 51 or an interface between the metal or silicide region 51 and the field electrode 21 acts as a generation region. Dependent on the implementation of the field electrode 21, the generation region formed by the metal or silicide region 51 may be the only generation region in the device or may be one of several generation regions. According to one embodiment, the field electrode 21 includes a monocrystalline semiconductor material. In this case, a generation region is only formed at the interface between the metal or silicide region 51 and the field electrode 21. According to a further embodiment, the field electrode 21 includes a polycrystalline or an amorphous semiconductor material, or a monocrystalline semiconductor material with foreign material atoms or crystal defects. In this case, there are additional generation regions in the field electrode 21.

Figure 9:
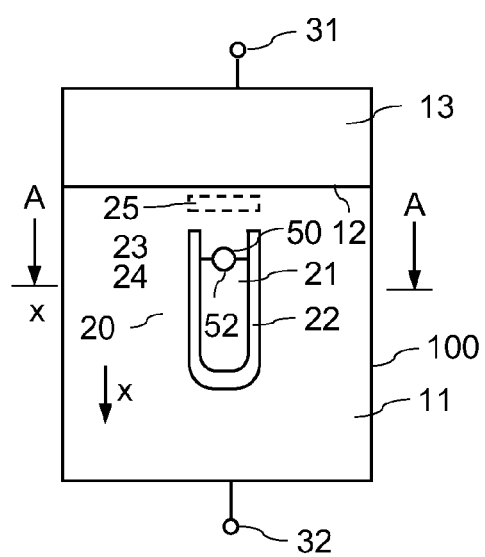
FIG. 9 illustrates a cross sectional view of a semiconductor device including a field electrode structure according to a ninth embodiment.

Referring to FIG. 9, the generation region 50 may include a void 52 adjoining the drift region 11. The interface between the drift region 11 and the void 52 acts as generation region 50. In the embodiment illustrated in FIG. 9, the void 52 also extends into the field electrode 21. However, this is only an example. The void 52 could also be distant to the field electrode 21. Like the field stop region 23 explained with reference to FIGS. 1 to 6, the generation region 50 is arranged adjacent or neighboring the field electrode 21 in the current flow direction x of the semiconductor device. The generation region 50 can be arranged within the field electrode dielectric 22 or could also be arranged outside the field electrode dielectric 22 but in line with the field electrode 21 in the current flow direction x so that charge carriers generated in the generation region 50 are driven through the opening 26 into the field electrode 21.

Figure 10:
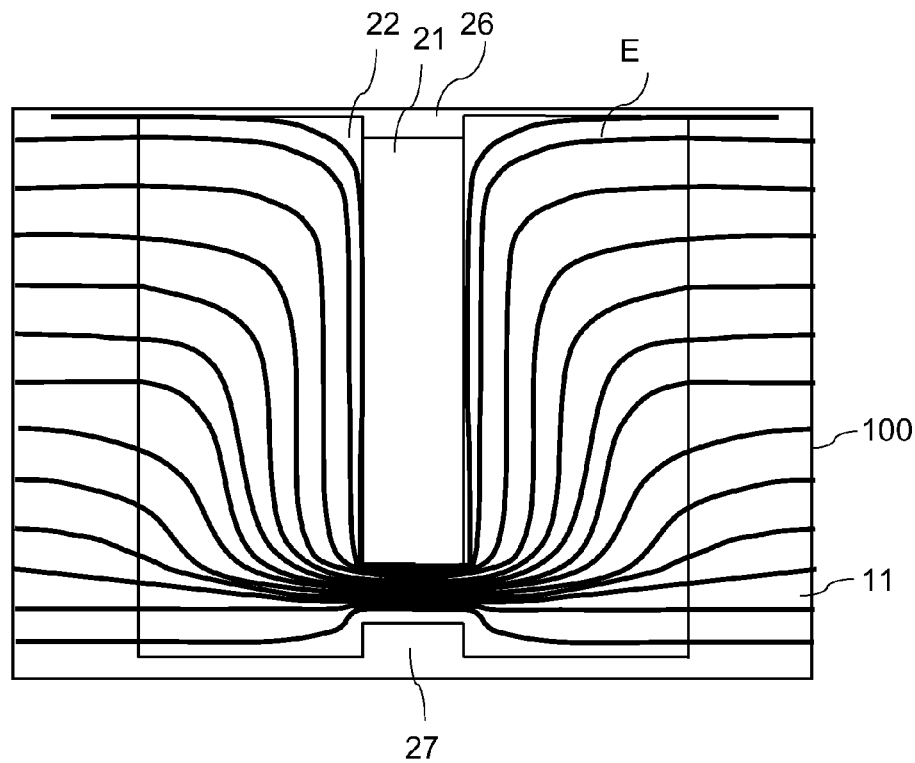
FIG. 10 illustrates equipotential lines in a semiconductor device in the region of the field electrode structure when the semiconductor device is blocking.

FIG. 10 schematically illustrates equipotential lines of an electric potential in the region of the field electrode 21 and the field electrode dielectric 22 in a semiconductor device when the junction (not illustrated in FIG. 10) is reverse biased. The figure applies to semiconductor devices that include either a field stop region, such as the field stop region 23 explained with reference to FIGS. 1 to 6, or a generation region, such as the generation region 50 explained with reference to FIGS. 7 to 9. As can be seen from FIG. 10, there is no electric field within the field electrode 21. The electric potential of the field electrode 21 corresponds to the electrical potential, the drift region 11 has at a position at which the field stop region 23 or the generation region 50 is located.

Figure 11:
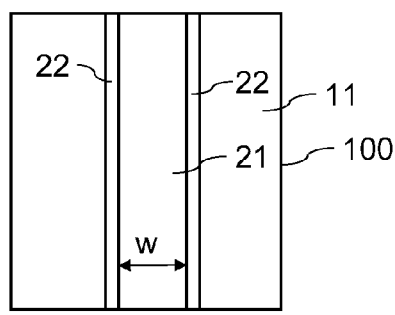
FIG. 11 illustrates a stripe-shaped field electrode structure.

FIG. 11 illustrates a cross sectional view of the semiconductor body 100 in a section plane A-A that is illustrated in FIG. 1. This section plane A-A cuts through the field electrode 21 and the field electrode dielectric 22 and is perpendicular to the section plane illustrated in FIGS. 1 to 9. In the embodiment illustrated in FIG. 11, the field electrode 21 has a stripe-shape and extends longitudinally in a direction perpendicular to a direction in which the width w of the field electrode 21 is defined.

Figure 12:
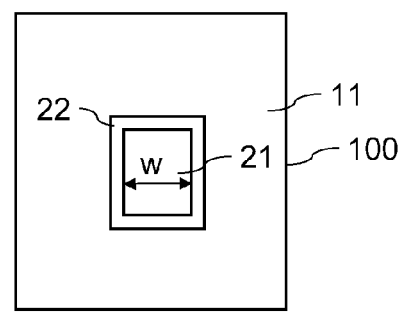
FIG. 12 illustrates a pile-shaped field electrode structure.

FIG. 12 illustrates a further embodiment in which the field electrode 21 has a pile-shape. In the embodiment illustrated in FIG. 12, the field electrode 21 has a rectangular cross section. However, this is only an example. The pile-shaped field electrode 21 could also have any other type of cross section, such as, for example an elliptical cross section, a hexagonal cross section, or any other polygonal cross section.

Figure 13:
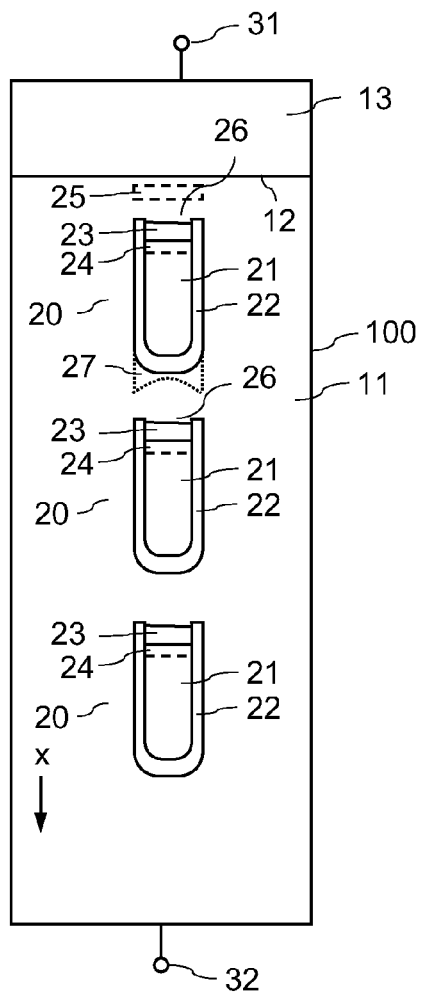
FIG. 13 illustrates a cross sectional view of a semiconductor device according to a first embodiment that includes a plurality of field electrode structures arranged in line with each other in a current flow direction of the semiconductor device.

FIG. 13 illustrates a cross sectional view of an embodiment of a semiconductor device that includes a plurality of field electrode structures 20 that are distant to each other in the current flow direction x of the semiconductor device. The semiconductor device according to FIG. 13 includes three field electrode structures 20. However, this is only an example. The number of field electrode structures 20 can be selected arbitrarily, in particular dependent on the desired voltage blocking capability of the semiconductor device and dependent on the length of the drift region 11. The length of the drift region 11 is the dimension of the drift region 11 in the current flow direction. When in the device according to FIG. 13, the junction 12 is reverse biased so that a depletion region expands in the drift region 11, the depletion region first reaches the field electrode structure 20 arranged closest to the junction 12 so that the field electrode 21 of this field electrode structure is biased in order to provide counter charges to ionized dopant atoms in the drift region 11. When the depletion region propagates further in the drift region 11, and reaches a next field electrode structure 20, the field electrode 21 of this field electrode structure is also biased. This process proceeds, when the voltage reverse biasing the junction 12 increases, until the field electrode 21 of the field electrode structure most distant to the junction 12 is biased.

The field electrode structures 20 illustrated in FIG. 13 correspond to the field electrode structure 20 explained with reference to FIG. 1. However, this is only an example. Any other field electrode structure 20 with a field stop region 23 and/or a generation region 50 explained hereinbefore could be employed in the semiconductor device according to FIG. 13 as well. According to one embodiment, the individual field electrode structures 20 are implemented in the same way. According to a further embodiment, different field electrode structures 20 are employed in one semiconductor device.

In the semiconductor device according to FIG. 13, the individual field electrode structures 20 are in line with each other in the current flow direction x. The optional shielding structure 25 is arranged between the field electrode structure 20 arranged closest to the junction 12 and the junction 12. For the remaining field electrode structures 20 a neighboring field electrode structure, in particular the field electrode dielectric 22 of the neighboring field electrode structure acts as a shielding structure, so that no additional shielding structures are required for these field electrode structures.

Referring to what is illustrated in dotted lines in FIG. 13, the semiconductor device may include a charge carrier trap 27 for charge carriers of a charge carrier type complementary to the charge carriers trapped in the field electrode 21 when the junction 12 is reverse biased. In particular when the field electrode structure 20 includes a generation region those complementary charge carriers are generated when the field electrode 21 is charged or biased. In the embodiment illustrated in FIG. 13, the charge carrier trap 27 is arranged at the field electrode dielectric 22 at that longitudinal end of the field electrode 21 that faces away from the opening 26. The charge carrier trap 27 may include a curved surface (as illustrated in FIG. 13) that faces the opening 26 of a neighboring field electrode structure 20, or may include a plane surface (not illustrated). The charge carrier trap 27 may be formed as a section of the field electrode dielectric 22 and may include the same material as the field electrode dielectric 22. One charge carrier trap 27 formed at one end of one field electrode structure 20 traps charge carriers generated in a generation region (not shown in FIG. 13) of a neighboring field electrode structure 20. The shielding structure 25 adjacent the field electrode structure 20 that is closest to the junction 12 may act as a charge carrier trap for complementary charge carriers generated in this field electrode structure 20.

Figure 14:
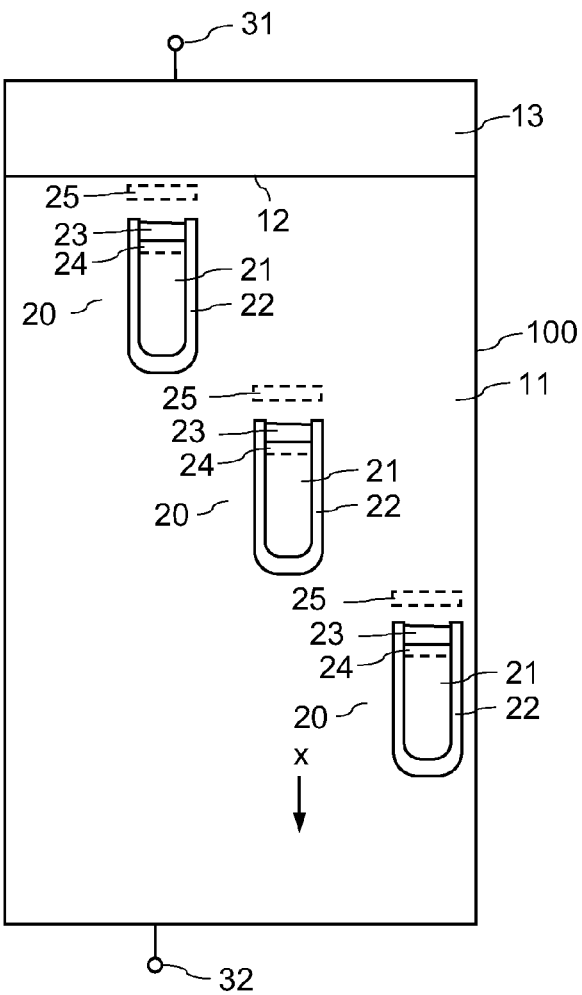
FIG. 14 illustrates a cross sectional view of a semiconductor device according to a second embodiment that includes a plurality of field electrode structures arranged offset in a direction perpendicular to the current flow direction.

FIG. 14 illustrates a further embodiment of a semiconductor device with a plurality of field electrode structures 20. In this semiconductor device the individual field electrode structures 20 are also arranged distant in the current flow direction x. However, the individual field electrode structures 20 are not in line with each other but are offset in a direction perpendicular to the current flow direction x. According to one embodiment, the structure illustrated in FIG. 14 is employed as an edge termination structure in a vertical semiconductor device. In this case, the structure with the offset field electrode structures 20 is arranged in an edge region of the semiconductor body 100, which is a region of the semiconductor body 100 close to a (vertical) edge of the semiconductor body 100. Especially when used as an edge termination structure, optional shielding structures adjacent the individual field electrode structures 20 can be omitted.

FIG. 15 illustrates a further embodiment of a semiconductor device that includes a plurality of field electrode structures 20. In this semiconductor device, a generation region 50 is formed between the field electrode 21 and the drift region 11 and/or within the field electrode 21. Further, the field electrode 21 of a field electrode structure 20 arranged closest to the junction 12 extends to a shielding structure 25. The field electrodes 21 of the other field electrode structures 20 in the current flow direction x extend to or into the field electrode dielectric 22 of a neighboring field electrode structure 20. Those regions of the field electrode dielectric 22 of one field electrode structure 20 to which or into which the field electrode 21 of a neighboring field electrode structure 20 extends form a charge carrier trap 27 form complementary charge carriers. The generation regions 50 are interfaces between the field electrodes 21 and the drift region 11 that are distant to an outer edge of the field electrode dielectric 22 in the direction perpendicular to the current flow direction or the generation regions are arranged within the field electrodes 21. In each case, these generation regions 50 do not extend beyond the field electrode dielectric 22 in the direction perpendicular to the current flow direction.

Referring to the explanation above, the field electrode dielectric 22 basically is U-shaped, with a bottom section $22_1$ and two opposing leg sections $22_2$, $22_3$. Referring to FIGS. 16A to 16D this U-shape may be modified in many different ways. FIGS. 16A to 16D schematically illustrate embodiments of possible forms or geometries of the field electrode dielectric 22. Referring to FIGS. 16A and 16B the field electrode 21 and, therefore, the U-shape of the field electrode dielectric 22 may narrow in the direction of the opening 26. In the embodiment illustrated in FIG. 16C, the field electrode 21 has approximately a constant width, wherein the field electrode dielectric 22 only narrows in a region close to the opening 26. Referring to FIG. 16D the field electrode dielectric 22 could also be bottle-shaped. FIGs. 16A to 16D illustrate only several of many possible ways in which the U-shape of the field electrode dielectric 22 can be modified.

Figure 17:
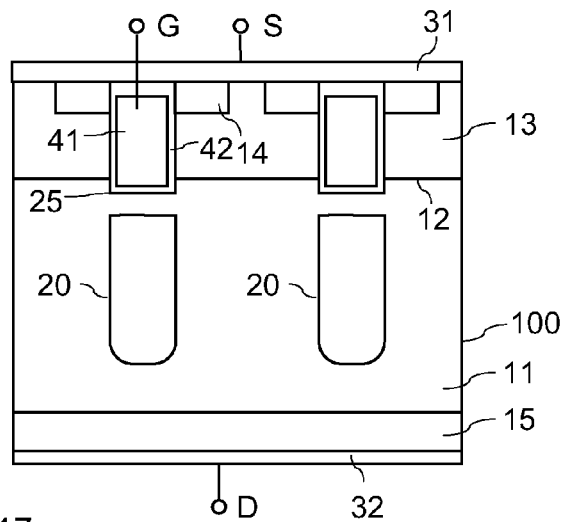
FIG. 17 illustrates a first embodiment of a semiconductor device implemented as a transistor.

FIG. 17 illustrates a cross sectional view of a semiconductor device with a field electrode structure 20 implemented as an MOS transistor. In FIG. 17, as well as in FIGS. 18 to 21, the field electrode structures 20 are only schematically illustrated. Each of the field electrode structures explained with reference to FIGS. 1 to 16 herein below may be employed in these semiconductor devices. Referring to FIG. 17, the further device region 13 forms a body region of the MOS transistor and is doped complementarily to the drift region 11. The junction 12 between the drift region 11 and the body region 13 is a pn junction in this device. The MOS transistor further includes a source region 14 and a drain region 15. The body region 13 is arranged between the source region 14 and the drift region 11, and the drift region 11 is arranged between the body region 13 and the drain region 15. A gate electrode 41 is adjacent the body region 13 and dielectrically insulated from the body region 13 by a gate dielectric 42.

The MOS transistor can be implemented as an enhancement transistor (normally-off transistor). In this case, the body region 13 adjoins the gate dielectric 42. The semiconductor device could also be implemented as a depletion transistor (normally-on transistor). In this case, a channel region (not shown) of the same doping type as the source region 14 and the drift region 11 extends between the source region 14 and the drift region 11 along the gate dielectric 42 in the body region 13.

The MOS transistor can be implemented as an n-type transistor. In this case, the source region 14 and the drift region 11 are n-doped, while the body region 13 is p-doped. The semiconductor device could also be implemented as a p-type transistor. In this case, the source region 14 and the drift region 11 are p-doped, while the body region 13 is n-doped. Further, the MOS transistor can be implemented as a MOSFET or as an IGBT. In a MOSFET, the drain region 15 is of the same doping type as the drift region 11, while in an IGBT the drain region 15 is doped complementarily. In an IGBT the drain region 15 is also referred to as collector region instead of drain region.

The MOS transistor according to FIG. 17 can be implemented as a vertical transistor. In this case, the source region 14 and the drain region 15 are arranged distant in a vertical direction of the semiconductor body 100, the vertical direction being a direction perpendicular to first and second surfaces of the semiconductor body 100. In a vertical transistor the current flow direction x corresponds to the vertical direction of the semiconductor body 100. However, the transistor could also be implemented as a lateral transistor. In this case, the source region 14 and the drain region 15 are arranged distant in a lateral or horizontal direction of the semiconductor body 100, so that source and drain electrodes of the transistor are arranged on one side of the semiconductor body. In the MOS transistor according to FIG. 17, the first electrode 31 forms a source electrode that contacts the source and body regions 14, 13 and that is connected to a source terminal S, while the second electrode 32 forms a drain electrode that is electrically connected to the drain region 15 and a drain terminal D. The gate electrode 41 is electrically connected to a gate terminal G. Like a conventional transistor the transistor according to FIG. 17 may include a plurality of identical transistor cells, with each transistor cell including a source region 14, a body region 13 and a section of the gate electrode 41. The drift region 11 and the drain region 15 can be common to the individual transistor cells. The individual transistor cells are connected in parallel in that the individual source regions 14 are connected to the source electrode 31 and in that the individual gate electrodes 41 are connected to a common gate terminal G.

In the transistor device according to FIG. 17 the field electrode structures 20 are in line with the gate electrode 41 and the gate dielectric 42 in the current flow direction x. The geometry of the field electrodes (not illustrated in FIG. 17) in a plane perpendicular to the plane illustrated in FIG. 17 may correspond to the geometry of the gate electrode 41 in this plane. In the semiconductor device according to FIG. 17 only one field electrode structure 20 is arranged in line with one gate electrode or gate electrode section 41. However, this is only an example. Referring to the embodiments illustrated in FIGS. 13 to 15 a plurality of field electrode structures 20 may be arranged in line with each other in the current flow direction x.

In the embodiment according to FIG. 17, in which the field electrode structures 20 are arranged in line with the gate electrode 41 and the gate dielectric 42, the gate electrode 41 and the gate dielectric 42 act as a shielding structure and/or as a charge carrier trap, so that no additional shielding structure is required.

The MOS transistor according to FIG. 17 can be operated like a conventional MOS transistor that can be switched on and off by applying a suitable drive potential to the gate electrode 41. When the MOS transistor is switched off and a voltage is applied between the drain and source terminals D, S that reverse biases the pn junction 12 between the drift region 11 and the body region 13, field electrodes (not shown in FIG. 17) of the field electrode structures 20 are biased as explained before so as to provide counter charges to dopant charges in the drift region 11.

Figure 18:
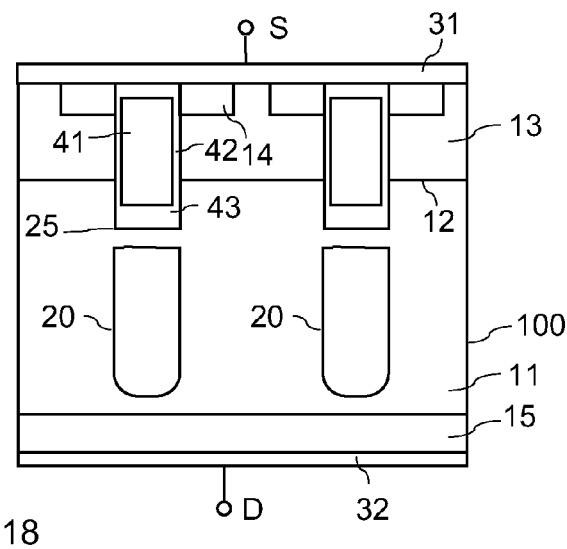
FIG. 18 illustrates a second embodiment of a semiconductor device implemented as a transistor.

FIG. 18 illustrates a further embodiment of a semiconductor device implemented as an MOS transistor. The semiconductor device of FIG. 18 is a modification of the semiconductor device of FIG. 17, where in the embodiment of FIG. 18 a dielectric layer 43 between the gate electrode 41 and the drift region 11 is thicker than the gate dielectric 42. The thickness of this dielectric layer 43 is, for example, between 100-nm and 500 nm.

Figure 19:
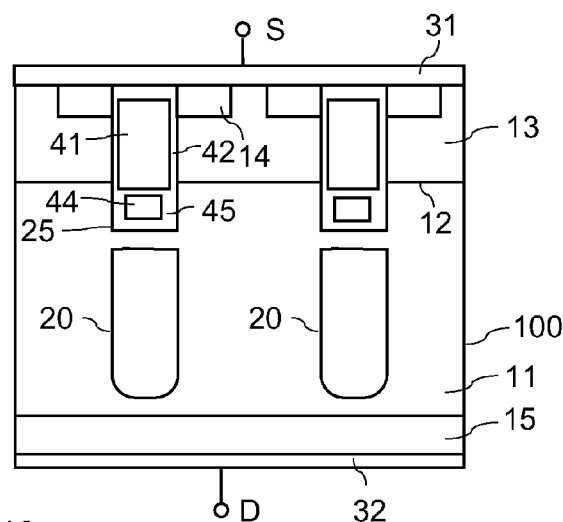
FIG. 19 illustrates a third embodiment of a semiconductor device implemented as a transistor.

FIG. 19 illustrates a further modification of the semiconductor device illustrated in FIG. 17. The semiconductor device of FIG. 19 includes a further field plate or field electrode 44. This further field electrode 44 is dielectrically insulated from the drift region 11 by a further field electrode dielectric 45. The further field electrode 44 is electrically connected to the source terminal S or the gate terminal G in a manner not illustrated in FIG. 19 and includes, for example, a metal or a polycrystalline semiconductor material. In the embodiment illustrated in FIG. 19, the further field electrode 44 is formed in the same trench as the gate electrode 41, so that the further field electrode 44 is in line with the gate electrode 41. However, this is only an example. The further field electrode 44 and the gate electrode 41 could also be implemented in different trenches.

Figure 20:
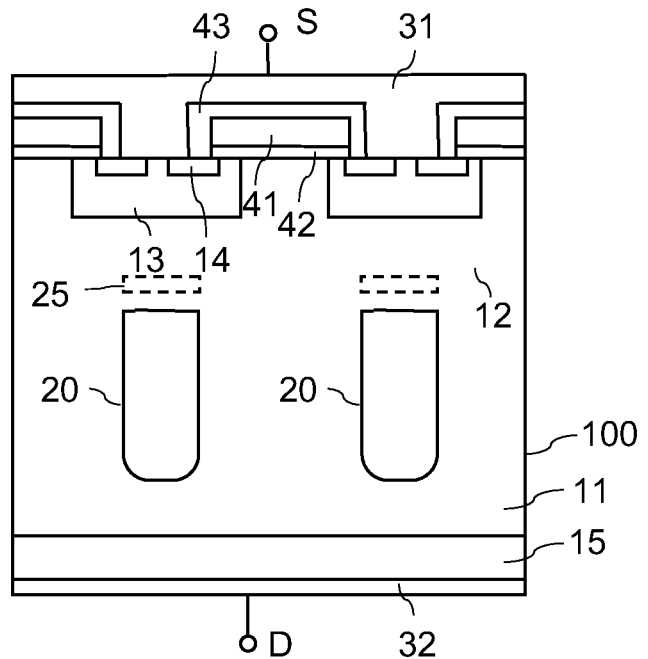
FIG. 20 illustrates a fourth embodiment of a semiconductor device implemented as a transistor.

In the embodiments illustrated in FIGS. 17 to 19, the gate electrode 41 is implemented as a trench electrode that is arranged in a trench of the semiconductor body 100. However, this is only an example. Any other type of gate electrode geometry may be applied as well. FIG. 20 illustrates a cross sectional view of a vertical transistor device with a planar gate electrode 41, which is a gate electrode arranged above a surface of the semiconductor body 100. In this embodiment, the drift region 12 includes sections that extend to the first surface of the semiconductor body 100 and to the gate dielectric 42 arranged above the first surface. The body region 13 may act as shielding structure, so that no additional shielding structure is necessary.

Figure 21:
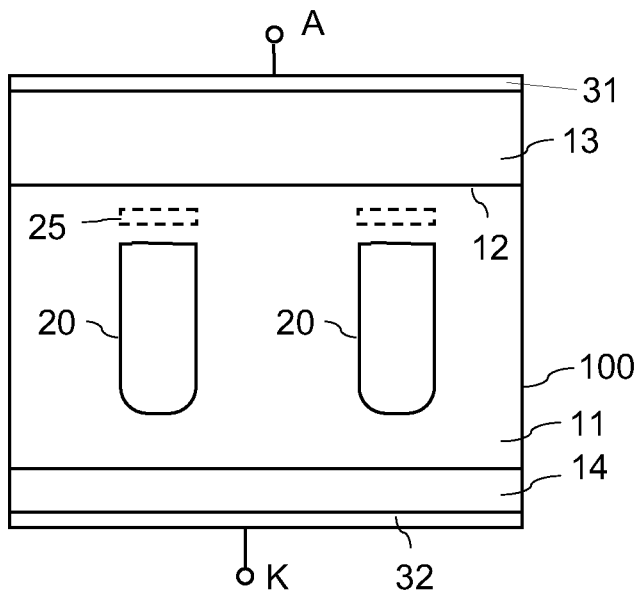
FIG. 21 illustrates an embodiment of a semiconductor device implemented as a diode.

FIG. 21 illustrates an embodiment of a semiconductor device implemented as a diode. In this semiconductor device the further device region 13 is either a semiconductor region of a doping type complementary to the drift region 11, so as to form a bipolar diode, specifically a p-i-n diode, or the further device region 13 is a Schottky region, so as to form a Schottky diode. The further device region 13 forms a first emitter region of the diode. The diode further includes a second emitter region 14 of the same doping type as the drift region 11 but more highly doped. The first emitter region 13 is connected to the first electrode 31 that forms an anode terminal A, and the second emitter region 14 is connected to the second electrode 32 that forms a cathode terminal K of the diode in this embodiment.

The diode according to FIG. 21 can be operated like a conventional diode. When a voltage is applied between the anode and cathode terminals A, K that reverse biases the pn junction 12 between the drift region 11 and the first emitter region 13, field electrodes (not shown in FIG. 17) of the field electrode structures 20 are biased as explained before so as to provide counter charges to dopant charges in the drift region 11.

Referring to FIGS. 22A to 22H, a first embodiment of a method for producing at least one field electrode structure 20 with a generation region 50 is explained. FIGS. 22A to 22H each show cross sectional views of a section of a semiconductor body 100 during individual process steps. These steps relate to a method for producing field electrode structures 20 in a vertical semiconductor device, which is a device in which the current flow direction corresponds to a vertical direction of the semiconductor body 100.

Figure 22A:
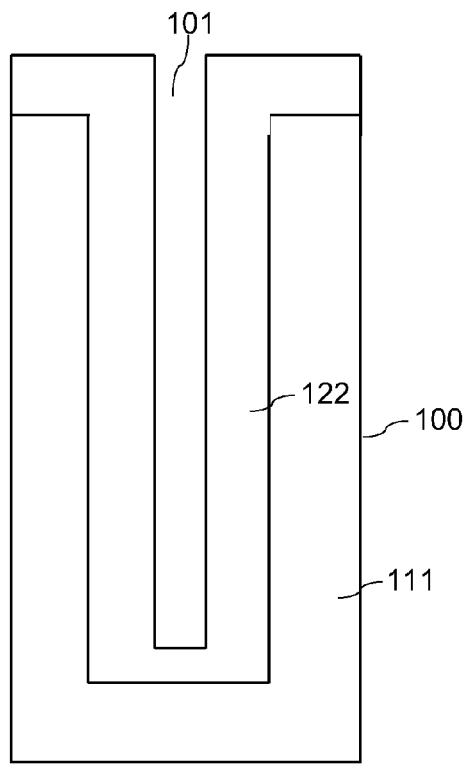
FIGS. 22A to 22H, illustrates a first embodiment of a method for producing a field electrode structure in a semiconductor body.
Figure 22B:
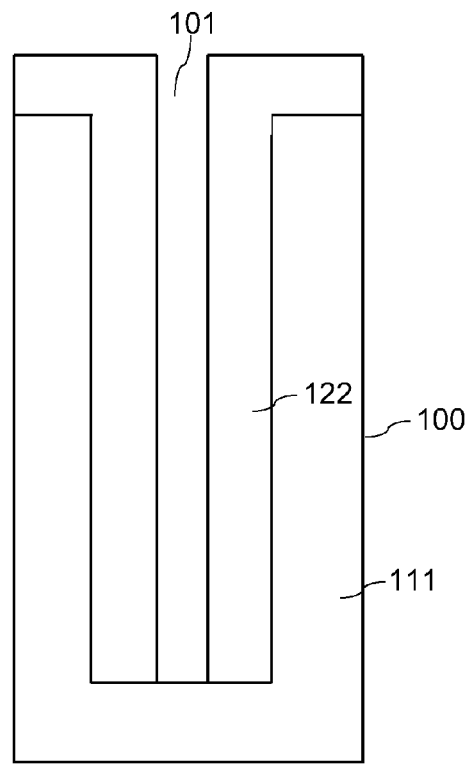

Referring to FIG. 22B the method includes forming a trench 101 in the semiconductor body 100, and forming a first dielectric layer 122 on sidewalls of the trench 101. Forming the first dielectric layer 122 on the sidewalls of the trench 101 may include forming the first dielectric layer 122 on the bottom and the sidewalls of the trench 101, as illustrated in FIG. 1, and may include removing the first dielectric layer 122 from the bottom of the trench 101. Optionally, the first dielectric layer 122 is also formed on that surface of the semiconductor body 100 in which the trench 101 is formed. Forming the trench 101 may include conventional method steps for forming a trench in a semiconductor body, such as an etching process. Removing the dielectric layer 122 at the bottom of the trench 101 may include an etching process, such as an anisotropic etching process.

Sections of the first dielectric layer 122 along the sidewalls of the trench 101 will be part of the field electrode dielectric 22 in the finished semiconductor device. Semiconductor regions 111 of the semiconductor body 100 adjoining the dielectric layer 122 will form parts of the drift region 11 of the finished semiconductor device. The first dielectric layer 122 is, for example, an oxide layer, such as a silicon dioxide layer.

Figure 22C:
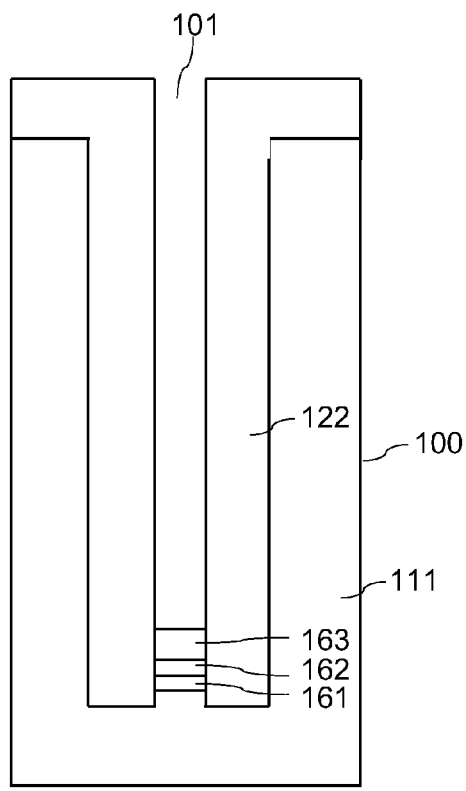

Referring to FIG. 22C a second dielectric layer 163 is formed on the bottom of the trench 101. According to one embodiment, forming the second dielectric layer 163 includes forming a silicide 161 at the bottom of the trench. The silicide 161 is, for example a titanium silicide (TiSi), cobalt silicide (CoSi), or tungsten silicide (WSi). Further, a polycrystalline semiconductor material 162, such as polysilicon, is formed on the silicide 161. Forming the polycrystalline semiconductor material 162 includes, for example, a selective epitaxial growth process. In this process a rough polysilicon 162 grows on the silicide 161. Further, the polysilicon layer 162 is at least partially oxidized. Oxidizing the rough polysilicon results in a rough oxide forming the second dielectric layer 163.

According to one embodiment, an optional selective epitaxial process is performed before producing the silicide 161. In this selective epitaxial process a semiconductor material is grown on the bottom of the trench 101, while the silicide 161 is formed on this grown semiconductor region.

Figure 22D:
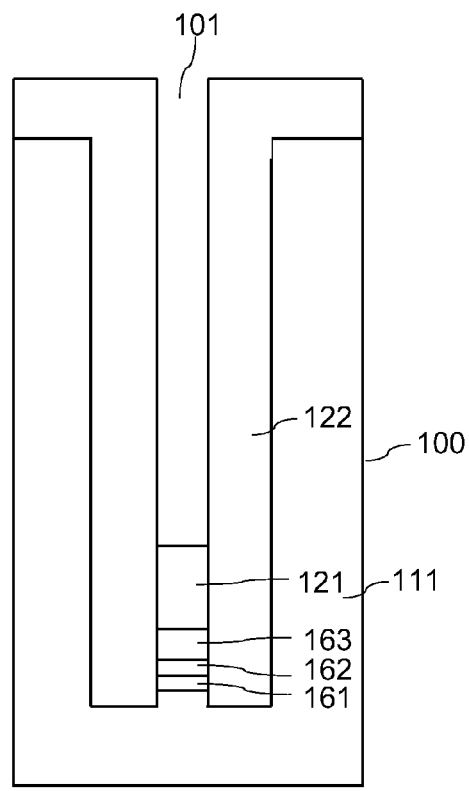

Referring to FIG. 22D a further polysilicon layer 121 is formed on the oxide 163. This further polysilicon layer 121 is, for example, formed using a selective epitaxial growth process in which polysilicon grows on the rough oxide 163 on the bottom of the trench 101, but not on the dielectric layer 122, such as an oxide, on the sidewalls of the trench 101. The polysilicon layer 121 forms a part of one field electrode 21 in the finished semiconductor device.

Figure 22E:
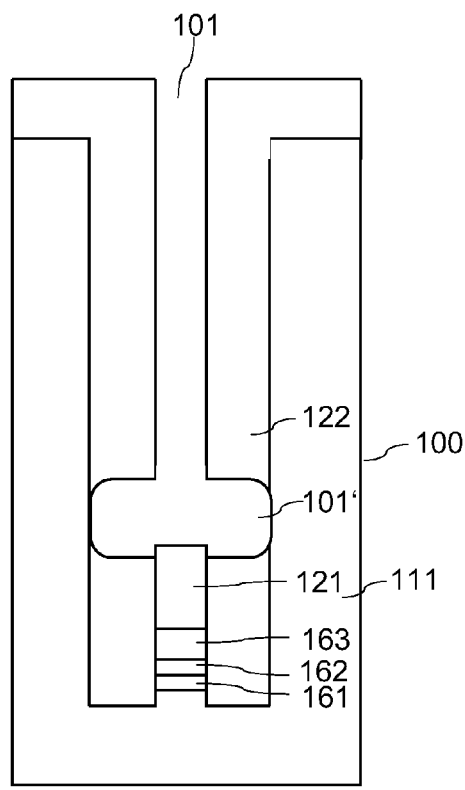

Referring to FIG. 22E, next process steps include removing the dielectric layer 122 at the bottom of the trench 101, which is at the top of the polysilicon layer 121, at the sidewalls of the trench 101, so as to expose the semiconductor body 100 at the sidewalls of the trench 101. In this process, a void 101' is formed in the trench 101 and extends to the semiconductor material in a lateral direction. Producing the void 101' may include a temperature process in a hydrogen atmosphere. Assume that the dielectric layer 122 is a silicon dioxide ($SiO_2$) layer. The temperature process in the hydrogen atmosphere then causes silicon atoms from the polysilicon layer 121 to accumulate at the dielectric layer 122 close to the surface of the polysilicon layer 121. The accumulated silicon atoms react with the silicon dioxide molecules from the dielectric layer 122 so that volatile silicon oxide (SiO) is formed, i.e. $Si+SiO_2 \rightarrow 2SiO$.

The void 101' is formed where $SiO_2$ molecules from the dielectric layer 122 react with silicon from the polysilicon layer 121. According to one example, the duration of the temperature process is selected such that the void 101' produced in the dielectric layer 122 extends to the semiconductor region 111 of the semiconductor body 100.

Figure 22F:
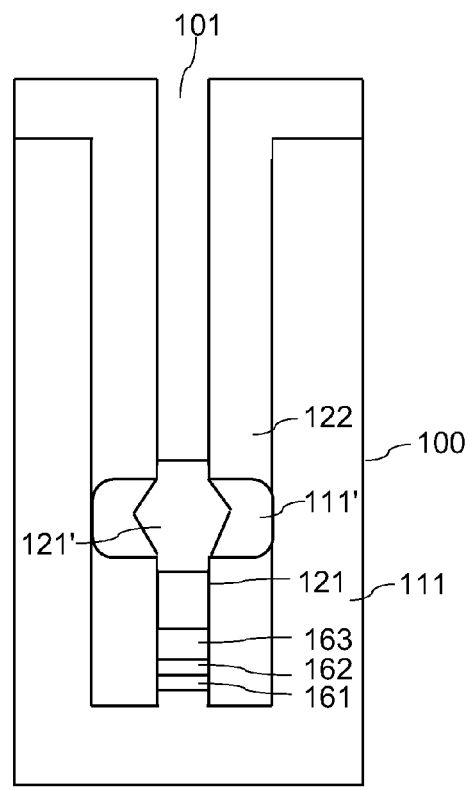

Referring to FIG. 22F, the polysilicon layer 121 is etched back to below a bottom of the void 101' formed in the process illustrated in FIG. 21E. Further, a monocrystalline semiconductor material 111' is grown on the semiconductor body 100 on the sidewalls of the void 101', and a polycrystalline semiconductor material 121' is further grown on the polysilicon layer 121. This monocrystalline semiconductor material 111' and the polycrystalline material 121' can be produced in one process step that includes a selective epitaxial growth process. In this process semiconductor material grows in a monocrystalline manner on the semiconductor body 100 on the sidewalls of the void 101', and grows in a polycrystalline manner on the polysilicon layer 121. This process is stopped, when the void 101' has been completely filled with monocrystalline and polycrystalline semiconductor material.

The result of the process steps explained with reference to FIGS. 22A to 22F is one field electrode, corresponding to field electrode 21 in the finished device and formed by the polysilicon layers 121, 121'. This field electrode has an interface with the semiconductor region 111' formed by the selective epitaxial growth process, wherein this interface forms a generation region 150. Those sections of the dielectric layer 122 adjoining the field electrode 121, 121', in particular adjoining the lower section 121 of the field electrode and the oxide 163 below the field electrode 121 form the field electrode dielectric 22 in the finished device.

Figure 22G:
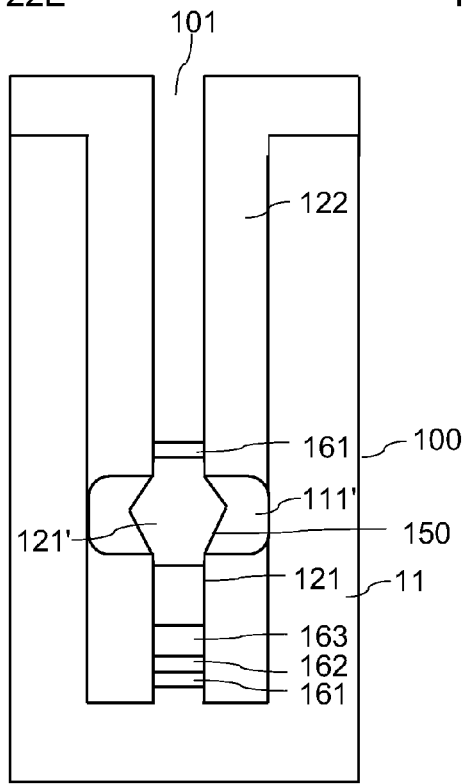
Figure 22H:
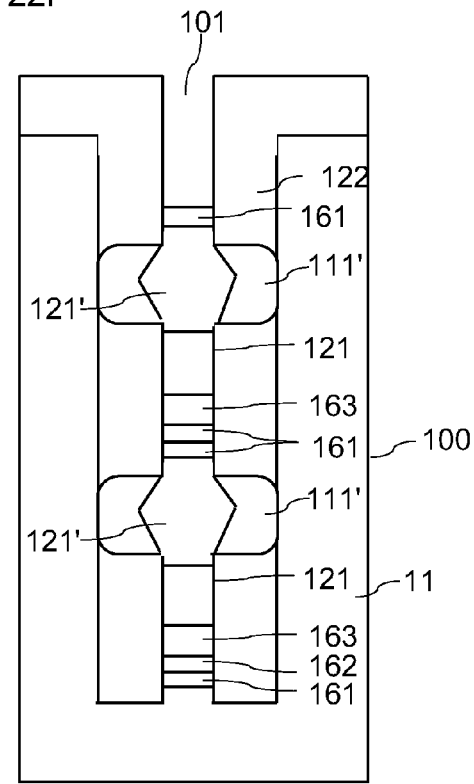

The process explained with reference to FIGS. 22A to 22F can be repeated several times on order to produce several field electrode structures one above the other. Referring to FIG. 22G, a next process sequence would include forming a silicide 161 on the field electrode 121, 121' and then performing the method steps explained with reference to FIGS. 22A to 22F, so as to obtain a structure illustrated in FIG. 22H, in which two field electrode structures each including a field electrode 121, 121' are arranged one above the other. In the embodiment illustrated in FIG. 22H, a residual trench 101 remains above the field electrode structures. In this residual trench a gate electrode could be implemented when it is desired to produce a vertical MOS transistor.

Figure 23A:
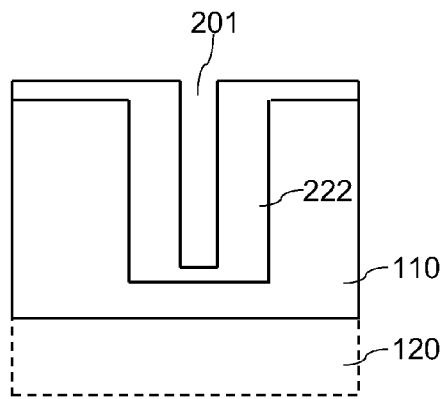
FIGS. 23A to 23H, illustrates a second embodiment of a method for producing a field electrode structure in a semiconductor body.
Figure 23B:
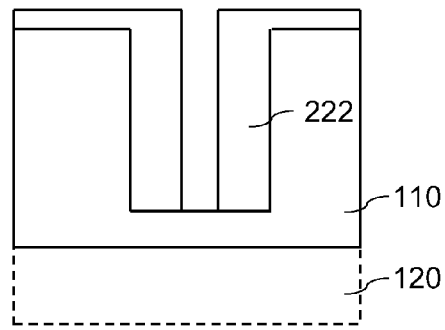

FIGS. 23A to 23H illustrate a further embodiment of a method for producing a field electrode structure in a semiconductor body. Referring to FIG. 23A, the method includes forming a trench 201 in a first semiconductor layer 110. The first semiconductor layer 110 is, for example, an epitaxial layer on a semiconductor substrate 120 (illustrated in dashed lines in FIG. 23A). Referring to FIG. 23B, the method further includes forming a first dielectric layer 222 on sidewalls of the trench 201. Forming the dielectric layer 222 on the sidewalls of the trench 201 may include forming the dielectric layer 222 on the bottom and the sidewalls of the trench 201, as illustrated in FIG. 23A, and removing the first dielectric layer 222 from the bottom of the trench 201. Removing the dielectric layer 222 from the bottom of the trench 201 may include an anisotropic etching process. Optionally, the dielectric layer 222 is also formed on a surface of the first semiconductor layer 100.

Figure 23C:
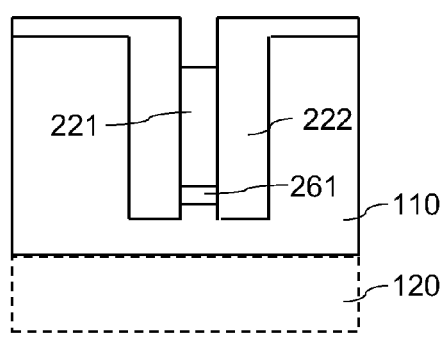

Referring to FIG. 23C, a second dielectric layer 261, such as an oxide layer is formed on the bottom of the trench 201. Forming the second dielectric layer 261 may, for example, include a thermal oxidation process. Optionally, an epitaxial semiconductor layer can be grown on the bottom of the trench 201 prior to forming the oxide layer 261. The oxide layer 261, when formed on an epitaxial layer, and the dielectric layer 222 form a bowl-like structure that may act as a charge carrier trap for complementary charge carriers.

According to a further embodiment, the first dielectric layer 222 and the second dielectric layer 261 are formed by common method steps, such as, for example a deposition or a thermal oxidation process. In this method, the first dielectric layer 222 as illustrated in FIG. 23A may remain on the bottom of the trench 201, so that the method steps illustrated in FIGS. 23B and 23C of removing the dielectric layer 222 from the bottom and forming a new dielectric layer on the bottom may be omitted.

Further, referring to FIG. 23C, a field electrode 221 is formed on the second dielectric layer 261. The field electrode 221 is, for example a polysilicon layer. Forming the polysilicon layer 221 includes, for example, a deposition process. The field electrode 221 does not completely fill the trench 201.

Figure 23D:
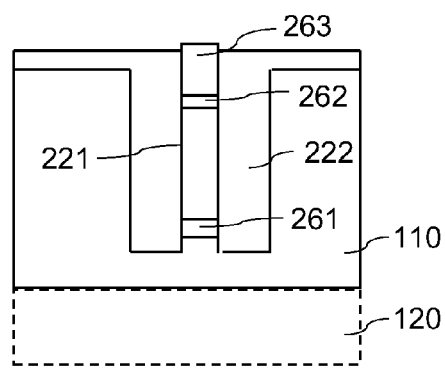

Referring to FIG. 23D an optional silicide layer 262 is formed on the polysilicon layer 221.

Figure 23E:
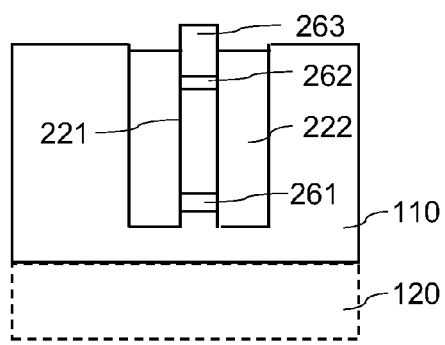
Figure 23F:
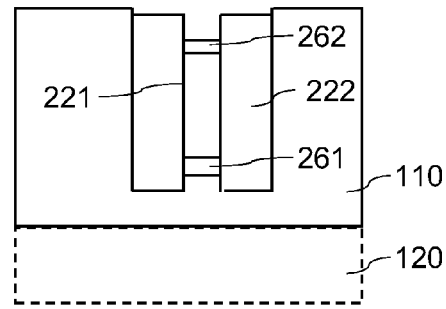
Figure 23G:
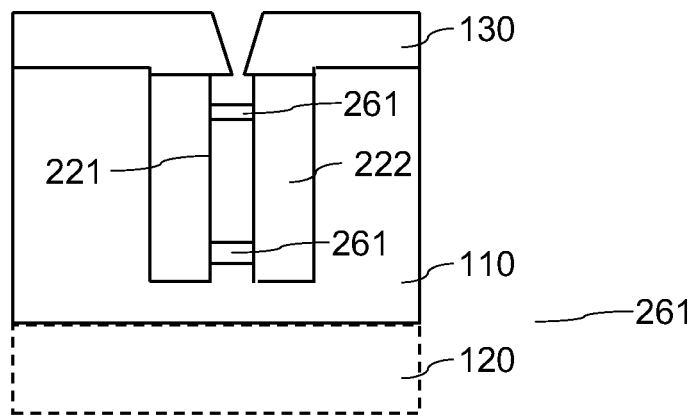

Referring to FIG. 23G, in further method steps a second monocrystalline semiconductor layer 130 is grown on uncovered surface sections of the first semiconductor layer 110. This monocrystalline semiconductor layer 130 overgrows the first dielectric layer 222 in a lateral direction but does not grow on this first dielectric layer 222. This epitaxial growth process, which is, for example, a selective epitaxial growth process is stopped before the trench 201 above the field electrode 221 or the optional silicide layer 262 is completely closed.

When, as illustrated in FIG. 23B, the first dielectric layer 222 is also grown on the surface of the first semiconductor layer 110, the first dielectric layer 222 has to be removed from the surface before growing the second semiconductor layer 130.

Referring to FIGS. 23D to 23F, removing the first dielectric layer 222 from the surface may include forming a mask or sacrificial layer 263 on the field electrode 221 or the silicide layer 262, respectively. The sacrificial layer 263 completely fills the trench 201. The mask or sacrificial layer 263 includes, for example, carbon.

In next method steps illustrated in FIG. 23E the dielectric layer 222 is removed from the surface of the semiconductor layer 110, using, for example, an etching process. In this process, the first dielectric layer 222 may not only be removed from the surface but may also be etched back to be below the surface of the semiconductor layer 110.

Referring to FIG. 23F, the sacrificial layer 263, which is, for example, a carbon layer, is removed.

Figure 23H:
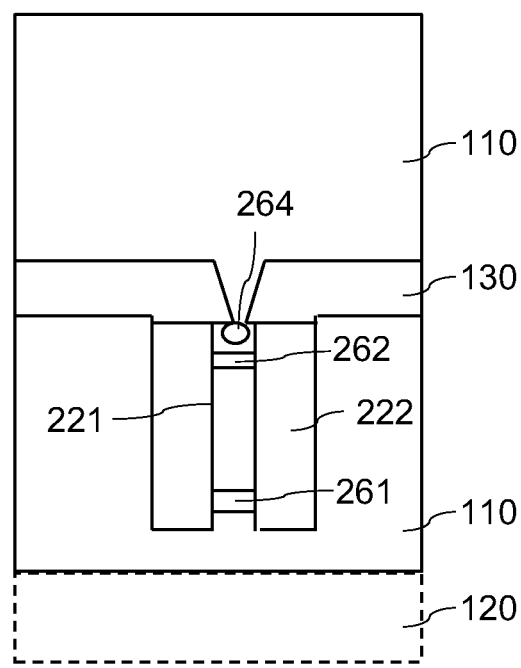

Referring to FIG. 23H, a further semiconductor layer 110 is epitaxially grown on the semiconductor layer 130. In this process the void above the silicide layer 262 is partially filled. However, a void 264 remains that is part of a generation region. In the structure illustrated in FIG. 23H, the dielectric layer 222 and the oxide 261 correspond to the field electrode dielectric 22 in a finished device, the polysilicon layer 221 corresponds to the field electrode 21, and the interface between the void 264 and the surrounding semiconductor material corresponds to the generation region 50.

The process steps explained with reference to FIGS. 23A to 23H can be repeated several times, so as to form several field electrode structures one above the other.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", an and the are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a drift region of a first doping type;
a junction between the drift region and a device region, the junction being a pn-junction or a Schottky junction adjacent to an anode terminal of a Schottky diode; and
at least one field electrode structure in the drift region and separated from the device region, the at least one field electrode structure comprising:
a field electrode;
a field electrode dielectric adjoining the field electrode and arranged between the field electrode and the drift region, and having an opening facing away from the field electrode and towards the junction; and
a field stop region of the first doping type and more highly doped than the drift region, the field stop region connecting the field electrode to the drift region through the opening of the field electrode dielectric.

2. The semiconductor device of claim 1, wherein the field stop region is at least partially arranged within the field electrode dielectric.

3. The semiconductor device of claim 2, wherein the field stop region is completely arranged within the field electrode dielectric.

4. The semiconductor device of claim 1, wherein the field electrode includes a semiconductor material of the first doping type and more highly doped than the drift region.

5. The semiconductor device of claim 4, wherein the field electrode and the field stop region have the same doping concentration.

6. The semiconductor device of claim 1, wherein the field electrode includes one of a metal and a polycrystalline semiconductor material.

7. The semiconductor device of claim 6, further comprising a contact region arranged between the field electrode and the field stop region.

8. The semiconductor device of claim 1, wherein the field stop region completely separates the field electrode from the drift region.

9. The semiconductor device of claim 1, wherein a section of the field electrode adjoins the drift region.

10. The semiconductor device of claim 9, wherein the field electrode includes at least one of a metal and a polycrystalline semiconductor material.

11. The semiconductor device of claim 1, wherein the semiconductor device has a current flow direction and the field stop region does not extend more than 200 nm beyond the field electrode dielectric into the drift region in a direction perpendicular to the current flow direction.

12. The semiconductor device of claim 1, wherein the semiconductor device has a current flow direction and the field stop region does not extend beyond the field electrode dielectric in a direction perpendicular to the current flow direction.

13. The semiconductor device of claim 1, wherein the field electrode dielectric has a length extending along a current flow direction of the semiconductor device, and has a width extending in a direction perpendicular to the current flow direction, and wherein a ratio between the length and the width is higher than 1.

14. The semiconductor device of claim 1, wherein the at least one field electrode structure comprises a shielding region arranged distant to the opening of the field electrode dielectric in a current flow direction of the semiconductor device.

15. The semiconductor device of claim 1, further comprising a plurality of field electrode structures arranged distant to each other in a current flow direction of the semiconductor device.

16. The semiconductor device of claim 15, wherein the field stop regions of individual ones of the plurality of field electrode structures are implemented such that at least some of these field stop regions adjoin the field electrode dielectric of a neighboring field electrode structure.

17. The semiconductor device of claim 1, wherein the semiconductor device is a MOS transistor in which the device region is a semiconductor region of a second doping type and forms a body region, and wherein the MOS transistor further comprises:
a source region, wherein the body region is arranged between the drift region and the source region;
a drain region, wherein the drift region is arranged between the drain region and the body region; and
a gate electrode arranged adjacent the body region and dielectrically insulated from the body region by a gate dielectric.

18. The semiconductor device of claim 1, wherein the semiconductor device is a bipolar diode in which the device region is a semiconductor region of a second doping type and forms an emitter region.

19. The semiconductor device of claim 1, wherein the semiconductor device is a Schottky diode in which the device region is a Schottky region.

* * * * *